US008581757B2

(12) United States Patent
Schandl et al.

(10) Patent No.: US 8,581,757 B2
(45) Date of Patent: Nov. 12, 2013

(54) METHOD FOR VECTOR QUANTIZATION OF A FEATURE VECTOR

(75) Inventors: Stefan Schandl, Vienna (AT); Panji Setiawan, München (DE)

(73) Assignee: Siemens Enterprise Communications GmbH & Co. KG, Munich (DE)

(*) Notice: Subject to any disclaimer, the term of this patent is extended or adjusted under 35 U.S.C. 154(b) by 4 days.

(21) Appl. No.: 13/319,806

(22) PCT Filed: Jun. 30, 2010

(86) PCT No.: PCT/EP2010/003969
§ 371 (c)(1),
(2), (4) Date: Nov. 10, 2011

(87) PCT Pub. No.: WO2011/000567
PCT Pub. Date: Jan. 6, 2011

(65) Prior Publication Data
US 2012/0112934 A1    May 10, 2012

(30) Foreign Application Priority Data
Jul. 2, 2009 (EP) .................................... 09008685

(51) Int. Cl.
H03M 7/30    (2006.01)
(52) U.S. Cl.
USPC ........................................... 341/87; 341/106
(58) Field of Classification Search
USPC ............ 341/87, 106; 704/219–220, 224–226
See application file for complete search history.

(56) References Cited

U.S. PATENT DOCUMENTS

| 5,444,800 A  * | 8/1995  | Kim ............................. 382/239 |
| 6,836,225 B2 * | 12/2004 | Lee et al. ....................... 341/50 |
| 8,027,380 B2 * | 9/2011  | Vasilache et al. .............. 375/240 |

OTHER PUBLICATIONS

International Search Report for PCT/EP2010/003969 dated Nov. 8, 2010 (Form PCT/ISA/210) (German Translation).
International Search Report for PCT/EP2010/003969 dated Nov. 8, 2010 (Form PCT/ISA/210) (English Translation).
Written Opinion of the International Searching Authority for PCT/EP2010/003969 dated Nov. 8, 2010 (Form PCT/ISA/237).
Clarkson, "Nearest-Neighbor Searching and Metric Space Dimensions".
Orchard et al., "A Fast Nearest-Neighbor Search Algorithm", IEEE, Acoustics, Speech, and Signal Processing, 1991 International Conference on Acoustics, Speech & Signal Processing, ICASSP), Apr. 14, 1991, vol. 4, pp. 2297-2300.
Ruiz, An Algorithm for Finding Nearest Neighbours in (approximately) Constant Average Time, Pattern Recognition Letters, Jul. 1986, vol. 4, pp. 145-157.

(Continued)

Primary Examiner — Brian Young
(74) Attorney, Agent, or Firm — Buchanan Ingersoll & Rooney PC

(57) ABSTRACT

The invention relates to a method for the vector quantization of a feature vector, in particular with respect to a data compression of a signal to be transmitted or to be stored, particularly a voice signal or a video signal, wherein at least one codebook from a plurality of codebook vectors is searched for a code vector representing the feature vector. During the search, a sequence of codebook vectors is examined for the suitability thereof to represent the feature vector. In the course of the search for the code vector, a set of neighboring vectors is dedicated to at least one of the codebook vectors potentially to be examined, preferably prior to the search. The search for the code vector includes at least part of the neighboring vectors.

13 Claims, 2 Drawing Sheets

(56) References Cited

OTHER PUBLICATIONS

Ye et al., "Autocannibalistic and Anyspace Indexing Algorithms with Applications to Sensor Data Mining", Proceedings of the SIAQM International Conference on Data Mining, SDM 2009, Apr. 30, 2009-May 2, 2009, Sparks, Nevada, USA. SIAM 2009, pp. 85-96.

Written Opinion of the International Searching Authority for PCT/EP2010/003969 dated Nov. 8, 2010 (Form PCT/ISA/237) (English Translation).

International Preliminary Report on Patentability for PCT/EP2010/003969 dated Jan. 4, 2012 (Forms PCT/IB/373, PCT/ISA/237) (German Translation).

International Preliminary Report on Patentability for PCT/EP2010/003969 dated Jan. 4, 2012 (Forms PCT/IB/373, PCT/ISA/237) (English Translation).

\* cited by examiner

| | | | | |
|---|---|---|---|---|
| 125 | 395 | 132 | 132 |
| 134 | 130 | 134 | 130 |
| 127 | 126 | 572 | 126 |
| 133 | 125 | 133 | 127 |
| 131 | 124 | 112 | 131 |
| 43 | 395 | 126 | 573 |

123
124
125
126
127
128

Maximum Neighboring Vector Table

| | | | | |
|---|---|---|---|---|
| 125 | 395 | 132 | 132 |
| 134 | 130 | 134 | 130 |
| 127 | 126 | 572 | 126 |
| 133 | 125 | 133 | 127 |
| 131 | 124 | 112 | 131 |
| 43 | 395 | 126 | 573 |

123
124
125
126
127
128

Main Index in the Neighboring Vector Table

Indices for the Nearest Neighboring Vectors

Fig. 2

METHOD FOR VECTOR QUANTIZATION OF A FEATURE VECTOR

CROSS-REFERENCE TO RELATED APPLICATIONS

This application is the United States national phase under 35 U.S.C. §371 of PCT International Patent Application No. PCT/EP2010/003969, filed on Jun. 30, 2010, and claiming priority to European Application No. 09008685.1, filed on Jul. 2, 2009.

BACKGROUND OF THE INVENTION

1. Field of the Invention
Embodiments relate to data compression of a signal.
2. Brief Summary of the Invention
Embodiments provide a method for vector quantization of a feature vector, in particular with respect to data compression of a signal to be transmitted or stored, particularly a voice signal or video signal, wherein at least one codebook consisting of multiple codebook vectors is searched to find a code vector representing the feature vector, and during the search a sequence of codebook vectors is tested to determine their suitability to represent the feature vector.

This type of method is suitable for representing, i.e., in particular for coding, multi-dimensional feature vectors whose vector components are derived from an often wide range of possible values, using a comparatively small number of codebook vectors or using the indices for these codebook vectors, which clearly identify these codebook vectors. Such methods are used in connection with many common coding processes, especially in the area of voice, image, or video coding, but also for coding other signals, especially for the purpose of reducing the volume of the data to be transmitted or stored (data compression). The data volume is reduced by, among other things, replacing a number of different feature vectors with the same code vector, which represents all of these different feature vectors. A coding error occurs in such a case, because of the differences between these feature vectors, and the greater the distance between the feature vector to be coded and the code vector representing it, the greater this coding error becomes. The distance between vectors is measured here using a distance measurement defined by the application, which should have the mathematical characteristics of a metric or a standard.

Each codebook vector of a codebook is associated with a cell that surrounds this codebook vector in the feature vector area, which contains all those feature vectors that are represented by the codebook vector of this cell. This cell corresponds to the volume of all codebook vectors which, based on the selected distance measurement, do not lie closer to any other codebook vector of the codebook than to the codebook vector that is surrounded by this cell. The shape of the cell therefore depends upon the selected distance measurement and on the distribution of the codebook vectors in the feature vector area.

The greater the number of codebook vectors and the greater the density at which these codebook vectors are placed in the feature vector area, the lower the information loss related to such methods. In such cases, codebook vectors must not be distributed symmetrically in the feature vector area, but it can be advisable to have a concentration of codebook vectors in those parts of the feature vector area where representation precision is especially necessary or desirable. However, as the number of codebook vectors and their density in the feature vector area increases, so does the cost of determining an optimal code vector or even just a close-to-optimal code vector that best (or with acceptable errors) represents the feature vector to be coded.

Embodiments may offer a method for vector quantization of a feature vector which (compared to currently known methods) combines the greatest possible (increase in) precision with the lowest possible (increase in) cost.

BRIEF DESCRIPTION OF THE FIGURES

FIG. 2: a schematic representation of the process of eliminating surplus entries in the neighboring vector table.

DETAILED DESCRIPTION OF THE INVENTION

Figure 1:
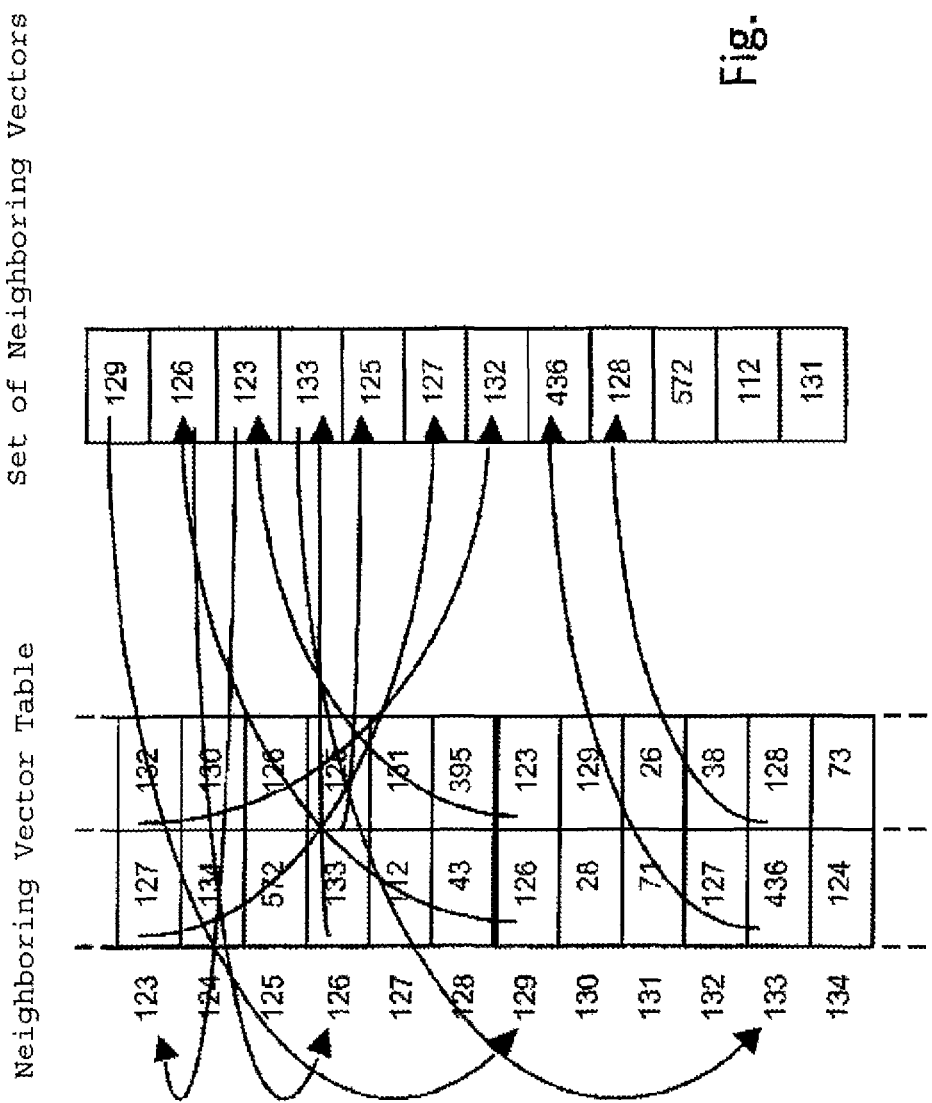
FIG. 1: a schematic representation of the generation of a set of neighboring vectors for a codebook vector using a neighboring vector table.

In embodiments of the invented method, at least one codebook containing multiple codebook vectors is searched looking for a code vector representing the feature vector, wherein during the search a sequence of codebook vectors is tested for their suitability to represent the feature vector. During or preferably before the beginning of this search, a set of neighboring vectors is allocated to at least one of the codebook vectors to be tested, and the search for the code vector includes all or part of the neighboring vectors.

With respect to the description of the present invention and in keeping with the commonly used terminology, a code vector that represents a feature vector should be understood to be a code vector which, in a search of the codebook, was determined to be the codebook vector that, from among the codebook vectors tested for their suitability to represent the feature vector, is more similar to the feature vector than any other codebook vector tested, or for which it is at least true that none of the codebook vectors tested is more similar to the feature vector than this code vector. For this case, two vectors are considered to be more similar, the smaller the distance between them according to a selected distance measurement.

As long as the search for suitable codebook vectors is not exhaustive in the sense that the entire codebook is completely searched and all codebook vectors are tested for suitability, there obviously can be one or more untested codebook vectors in the codebook that are more similar to the feature vector.

Because the codebook consists of a countable and finite volume of codebook vectors, the codebook vectors can reasonably be numbered and characterized clearly using an index: the codebook vector index. There is a clear relationship between the codebook vectors and the codebook vector indices, so the concepts of codebook vector and codebook vector index can be used synonymously, and this may occur at times in the present description, because it is common usage in the industry.

The set of neighboring vectors for a codebook vector preferably includes a volume of codebook vectors that are nearest to the codebook vector to which this set belongs according to a distance measurement in the codebook vector area, i.e., are at the shortest distances from that codebook vector. The distance measurement in the codebook vector area can be any distance measurement with the characteristics of a metric, in particular the Euclidian distance measurement.

Extending the search for the code vector that should represent the feature vector to at least some of the neighboring vectors should preferably ensure that, in the vicinity of a code vector, no other codebook vectors are missed that could better represent the feature vector to be coded. In this case, a first codebook vector represents a feature vector better than a second codebook vector if the first codebook vector has a lower distance measurement to the feature vector than the second codebook vector.

Preferably, the set of neighboring vectors ("next-neighbor array") for a codebook vector is determined using a neighboring vector table ("next-neighbor table") that assigns to each codebook vector, from among a number of codebook vectors in at least one codebook, a number of its nearest neighboring vectors. In this arrangement, starting from the codebook vector whose set of neighboring vectors should be determined and which is entered as the start vector in the set of neighboring vectors, the sequence of the nearest respective neighboring vectors to each already existing entry in the set of neighboring vectors is in turn entered in the set of neighboring vectors. This preferably occurs until new entries cease to be made or until the entry process is discontinued, for example because the number of neighboring vectors in the set of neighboring vectors has reached or exceeded a preset limit.

Preferably a neighboring vector table for a codebook vector is generated in which first a number of the nearest neighboring vectors are identified for at least some of the codebook vectors in at least one codebook, preferably by determining the respective distances, and in which the resulting neighboring vector table ("max-next-neighbor table") is modified by performing the following steps (which can also be described as "pruning" in the terminology of the industry):

The two nearest neighboring vectors to a codebook vector in the neighboring vector table are determined; they become the parent vectors for that codebook vector;

the two neighboring vectors nearest to the first parent vector in the neighboring vector table are determined; they become the offspring vectors of the first parent vector;

the second parent vector is deleted from the neighboring vector table and replaced by its nearest neighboring vector in the neighboring vector table, provided that one of the two offspring vectors from the first parent vector matches the second parent vector;

the two neighboring vectors nearest to the second parent vector in the neighboring vector table are determined; they become the offspring vectors of the second parent vector;

the first parent vector is deleted from the neighboring vector table and replaced by its nearest neighboring vector in the neighboring vector table, provided that one of the two offspring vectors from the second parent vector matches the first parent vector.

This should prevent a neighboring vector table in which some or all of the neighboring vectors mutually exclude each other.

It is especially preferable to use a method according to one of the described examples in order to reduce the magnitude of the coding error compared to some methods for voice or video coding. In this way, the expansion of the search to neighboring vectors can preferably be connected to a search using a standard method. Preferably, a set of neighboring vectors is generated for the code vector found with the standard method, to which the search for an optimal or nearly optimal code vector is then expanded. This occurs preferably before the start of the search for all or some of the codebook vectors, because in this way the search can be significantly accelerated. Construction of the next-neighbor arrays, and generally all operations that depend only on the codebook elements and not on an actual vector to be coded, are not part of the search in the codebook but rather are part of the constructions in this special codebook or its preparation with respect to an accelerated and/or improved search. In this way, operations that depend only on codebook elements and not on an actual vector to be coded are preferably not performed during the search and therefore during coding, but rather are preferably calculated well before that ("off-line" according to industry terminology).

The invention is described below in more detail based on preferred exemplary embodiments and with reference to the figures.

Preferred embodiments are shown with the example of a "wideband" (WB) voice codec according to the G.711 standard, because this standard includes the expanded G.711 standard as a "narrowband core." The wideband expansion G.711.1 of the G.711 standard uses a wideband MDCT codec (MDCT=Modified Discrete Cosine Transform) to code signal components in the frequency range between four and seven kHz. Details can be found, for example, in the publication "G.711.1: A Wideband Extension to ITU-T G.711," Y. Hiwasaki et al., G.711.1_1569104469.pdf.

In this expansion of the G.711 standard, the wideband signal components are coded by calculating 36 weighted and normalized coefficients in the MDCT range and then coded as six vectors for Dimension 6. In keeping with the standard method from the G.711.1 standard, the feature vector must be shown as a linear combination of two vectors derived from two codebooks with 32 codebook vectors each.

In order to keep the cost feasible when searching for a suitable codebook vector, often no exhaustive search for a codebook vector is done. As a result of this, code vector indices found through this standard procedure are not always optimal and can be improved upon. According to the present invention, this improvement is preferably achieved by having the search according to the standard method followed by a refined search according to the present invention, in which a set of neighboring vectors is determined for the code vector found with the standard method, and in which the search is expanded to all or part of this set of neighboring vectors.

An advantage of the invented method, in this and other embodiments, is that the same resources, i.e., the same codebook and the same criteria (such as gain), are used with it, unchanged, and that the parameters are coded in the same manner as for standard methods, so the improved coding does not require increased data transmission or data storage costs, and a "Null-Bit Enhancement Layer" can be offered because no extra bits or coding are required for this improvement.

A further advantage of the invented method can be seen in that, with an appropriate choice for the size NN_NB of the set of neighboring vectors, the additional expense and the additional precision achieved through it can easily be controlled. Experimental tests have shown that improved or optimal code vectors are very often found in the immediate vicinity of code vectors that were determined using a standard method. This knowledge is used by the invented method in very efficient ways to improve precision with a comparatively lower cost increase.

According to the G.711.1 standard, using the equation $$V(i_0, i_1, v) = \frac{\pm C_{H0w}(i_0(v)) \pm C_{H1w}(i_1(v))}{2}$$

for the feature vector $S_{HB}(v)$ to be coded approximates it (determines that it is near) to two vectors that come from two codebooks $C_{H0w}$ and $C_{H1w}$ with codebook size CB_SIZE=32.

Each of these codebooks therefore contains 32 vectors. This gives a total of CB_DIM=4×32×32=4096 code vectors. An exhaustive search through such a codebook for voice or video codes is an expensive mathematical undertaking, so standard methods include sub-optimal codebook searches in order to keep the cost within an acceptable range.

Using this process in the standard method, only 49% of the feature vectors are represented by an optimal code vector in the result. The core of the invented method is a set of neighboring vectors that is generated for a codebook vector using the codebook. This set essentially associates a codebook vector with the indices of its two nearest neighboring vectors. In this way, the number NB_NN of the nearest neighboring vectors can be limited, so as to limit the additional cost associated with the invented method.

Additional calculation advantages can also be used to limit costs. For example, because the feature vector area is a vector space (a linear space) from a mathematical standpoint (at least to the extent that the feature vector components come from a "body" in a mathematical sense), for each codebook vector CV in a codebook; the codebook appropriately includes that codebook vector's (vector-additive) inverse element—CV as well. The number of vectors or indices in the tables used with respect to the invented method (set of neighboring vectors, neighboring vector table, etc.) can often be reduced by taking advantage of corresponding symmetries, for example by halving (CB_DIM_H=2048) using a computerized scan of vector signs. It should be remembered in this case, however, that the actual number of codebook vectors is greater, CB_DIM=4096 in our example.

The procedure for generating the set of neighboring vectors can be described using the example in FIG. 1. In this example, first a neighboring vector table must exist and a preliminary optimal code vector must have been determined using a standard method. The vector index for this preliminary best code vector is then entered as the starting value in the set of neighboring vectors.

In the example shown in FIG. 1, it is index 129. The two indices in the neighboring vector table that belong to this starting index are then also entered in the set of neighboring vectors. In the example shown in FIG. 1, this involves indices 126 and 123, because these indices are the nearest neighboring vectors according to the neighboring vector table in FIG. 1. This procedure is then repeated for each index that was entered in the set of neighboring vectors, making sure that the same index is not entered twice in the set of neighboring vectors. In the example shown in FIG. 1, this could happen for index 125, for example, whose nearest neighbors according to the neighboring vector table have indices 572 or 126, but index 126 was already placed in the set of neighboring vectors.

The procedure is terminated when no more indices can be found or when the preset number of neighboring vectors in the set of neighboring vectors has been found and entered in the set of neighboring vectors. On this basis, the search for an optimal or nearly optimal code vector for the feature vector to be coded preferably extends to the all or part of the set of neighboring vectors, and the optimal or nearly optimal codebook vector found by this search is used as a better code vector for representing the feature vector.

As can easily be seen from the embodiment described here, an exhaustive search in the codebook can be avoided by using the invented method; however, significant improvement of coding precision can be achieved by finding a better code vector. Because of the special structure of the neighboring vector table shown in FIG. 1, a table size of only 2×2048 instead of NB_NN*2048 is required, which can save storage space.

The table of neighboring vectors (neighboring vector table) is preferably created by processing a maximum neighboring vector table ("max-next-neighbor table") that includes the maximum number of nearest neighbors and is preferably reduced by the thinning out process. This process of thinning-out or "pruning" the neighboring vector table is preferably used with the invented method to prevent situations in which all or many of the neighboring vectors mutually exclude each other.

The size of the original neighboring vector table (before pruning) is preferably CB_DIM_H*MAX_NBR_NN, where*represents the product and MAX_NBR_NN the preset number of nearest neighbors. This number becomes greater as the maximum allowable distance between the codebook vector whose nearest neighbor is included in the table and a nearest neighbor to that codebook vector increases. If such a limit were not specified, all codebook vectors in the codebook would be nearest neighbors to all codebook vectors, which would be meaningless.

In a first step, the codebook vectors whose neighboring vectors should be included in the neighboring vector table are entered in one column of the neighboring vector table. For each of these codebook vectors, the distance to all other codebook vectors is calculated and a preset number of nearest neighbor vectors is assigned to each codebook vector in the neighboring vector table and entered in the table. These entries are preferably sorted by the distance measurement.

In a second step, the thinning-out process can be performed for each codebook vector. This process finds the first two nearest neighboring vectors ("nearest code vectors") of an individual entry ("main code vector") for a codebook vector in the neighboring vector table. These two indices for the nearest neighboring vectors of this codebook vector are designated as parent indices. For the first parent index, the next two nearest neighboring codebook vectors and their indices are determined from the table, wherein the parent index is simply used as the main index ("main code vector") in the neighboring vector table. These two indices, found in this manner, are designated as offspring indices.

Even if only one of the two offspring indices, which were designated in this manner based on the first parent index, matches the second parent index, the second parent index is deleted from the neighboring vector table.

Similarly, the first parent index in the neighboring vector table is deleted even if only one of the two offspring indices, which were derived from the second parent index, matches the first parent index. An example of this is shown in FIG. 2, looking at main index 123, for example. The parent indices to this index 123 are codebook vector indices 127 and 125. The offspring indices of the first parent index are indices 131 and 124, and for the second parent index are indices 127 and 126. In this case the first parent index is deleted from the table, because it matches one of the offspring indices of the second parent index, namely index 127.

A deleted, i.e., removed, index is preferably replaced by its nearest neighboring codebook vector index in the neighboring vector table. This procedure is preferably carried out for all items in the neighboring vector table, preferably with a count kept of the number of entries deleted. This step is then repeated until the number of deletions counted in one pass through the neighboring vector table is 0, i.e., until no more deletions are made.

Experimental tests with voice signals have shown that the invented method can lead to significant improvement of voice coding precision. For different values of the size NB_NN of the set of neighboring vectors, the following table shows the coverage and complexity of a search for each according to the invention compared to a standard search or full search.

| Search method | Coverage | Complexity | Additional complexity |
| --- | --- | --- | --- |
| Standard | 48.9% | 2.755 | |
| Full search | 100.0% | 15.678 | |
| Search per the invention with NB_NN = 4 | 67.3% | 3.289 | 0.534 |
| Search per the invention with NB_NN = 6 | 70.1% | 3.405 | 0.650 |
| Search per the invention with NB_NN = 8 | 72.0% | 3.543 | 0.788 |
| Search per the invention with NB_NN = 10 | 72.8% | 3.690 | 0.935 |
| Search per the invention with NB_NN = 12 | 73.5% | 3.839 | 1.084 |
| Search per the invention with NB_NN = 14 | 73.7% | 3.977 | 1.222 |
| Search per the invention with NB_NN = 16 | 74.1% | 4.155 | 1.400 |

We claim:

1. A method for vector quantization of a feature vector, comprising:

searching at least one codebook comprising multiple codebook vectors to find a code vector representing a feature vector;

during the search, testing a sequence of codebook vectors to determine their suitability to represent the feature vector; and for at least one of the codebook vectors that can be tested during the search for the code vector representing the feature vector, determining a set of neighboring vectors before the beginning of the search and including in the search for the code vector representing the feature vector at least some of the neighboring vectors; and determining the set of neighboring vectors for a codebook vector using a neighboring vector table that assigns a number of nearest neighboring vectors to each codebook vector from among the multiple codebook vectors in the at least one codebook, in which, starting with the codebook vector whose set of neighboring vectors is to be determined and which is entered as a start vector in the set of neighboring vectors, a sequence of the respective nearest neighboring vectors for each already existing entry in the set of neighboring vectors is entered in turn in the set of neighboring vectors, continuing until no new entries are received or until entry is terminated because a number of neighboring vectors in the set of neighboring vectors has reached a preset limit.

2. The method of claim 1, comprising generating a neighboring vector table for a codebook vector in which first a number of the nearest neighboring vectors are identified for at least some of the codebook vectors in the at least one codebook, and modifying the neighboring vector table created as a result by repeating the following steps:

determining two nearest neighboring vectors to a codebook vector in the neighboring vector table and designating them as first and second parent vectors for that codebook vector;

determining two neighboring vectors next nearest to the first parent vector in the neighboring vector table and designating them as offspring vectors of the first parent vector;

deleting the second parent vector from the neighboring vector table and replacing it with its nearest neighboring vector in the neighboring vector table, provided that one of the two offspring vectors from the first parent vector matches the second parent vector;

determining two neighboring vectors nearest to the second parent vector in the neighboring vector table and designating them as offspring vectors of the second parent vector; and deleting the first parent vector from the neighboring vector table and replacing it with its nearest neighboring vector in the neighboring vector table, provided that one of the two offspring vectors from the second parent vector matches the first parent vector.

3. Reducing the magnitude of a coding error in at least one voice coding and video coding, comprising vector quantizing a feature vector according to a method for vector quantization of a feature vector, comprising:

searching at least one codebook comprising multiple codebook vectors to find a code vector representing a feature vector;

during the search testing a sequence of codebook vectors to determine their suitability to represent the feature vector; and for at least one of the codebook vectors that can be tested during the search for the code vector representing the feature vector, determining a set of neighboring vectors before the beginning of the search and including in the search for the code vector representing the feature vector at least some of the neighboring vectors; and wherein the feature vector is indicative of at least one of voice data and video data, and wherein the reduction of the magnitude of the coding error is relative to a magnitude of coding error when a feature vector is not quantized according to the method.

4. The method of claim 1, wherein said feature vector is at least one of a voice signal and a video signal.

5. The method of claim 2, wherein the nearest neighboring vectors are determined by measuring their distance from a codebook vector.

6. The method of claim 1 wherein the feature vector is a voice signal.

7. The method of claim 6 further comprising encoding the voice signal based on the code vector that was found to represent the feature vector.

8. The method of claim 7 wherein the encoding of the voice signal is compliant with standard G.711.

9. The method of claim 1 further comprising encoding a voice signal based on the code vector that was found to represent the feature vector.

10. The method of claim 1 wherein all of the neighboring vectors are included in the search for the code vector representing the feature vector.

11. The method of claim 2 wherein the feature vector is a voice signal.

12. The method of claim 11 further comprising encoding the voice signal based on the code vector that was found to represent the feature vector.

13. The method of claim 12 wherein the encoding of the voice signal is compliant with standard G.711.

* * * * *